US012004434B2

(12) United States Patent
Adusumilli et al.

(10) Patent No.: US 12,004,434 B2
(45) Date of Patent: Jun. 4, 2024

(54) FILL-IN CONFINED CELL PCM DEVICES

(71) Applicant: International Business Machines Corporation, Armonk, NY (US)

(72) Inventors: Praneet Adusumilli, Somerset, NJ (US); Matthew Joseph BrightSky, Armonk, NY (US); Guy M. Cohen, Ossining, NY (US); Robert L. Bruce, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 17/086,658

(22) Filed: Nov. 2, 2020

(65) Prior Publication Data
US 2022/0140237 A1     May 5, 2022

(51) Int. Cl.
    *H10N 70/00*           (2023.01)
    *H10N 70/20*           (2023.01)

(52) U.S. Cl.
    CPC ....... *H10N 70/8418* (2023.02); *H10N 70/043* (2023.02); *H10N 70/066* (2023.02); *H10N 70/231* (2023.02); *H10N 70/826* (2023.02); *H10N 70/8828* (2023.02)

(58) Field of Classification Search
None
See application file for complete search history.

(56) References Cited

U.S. PATENT DOCUMENTS

| 8,410,468 B2 | 4/2013 | Zheng et al. |
| 8,618,524 B2 | 12/2013 | Liang et al. |
| 2007/0160760 A1* | 7/2007 | Shin .................... H01L 27/2436 427/255.35 |
| 2007/0267620 A1 | 11/2007 | Happ |
| 2009/0227087 A1* | 9/2009 | Ramappa .......... H01L 21/76883 438/692 |
| 2011/0001107 A1* | 1/2011 | Zheng .................. H10N 70/068 438/102 |

(Continued)

FOREIGN PATENT DOCUMENTS

| KR | 20060101950 A | * | 9/2006 | ........... H10N 70/826 |
| WO | WO2013152088 | | 10/2013 | |

OTHER PUBLICATIONS

English translation of Kim Young Kuk et al (KR 20060101950 A), Memory and Manufacturing Method Thereof (Year: 2006).*

(Continued)

*Primary Examiner* — Khaja Ahmad
(74) *Attorney, Agent, or Firm* — Daniel Morris; Otterstedt & Kammer PLLC

(57) ABSTRACT

A method for manufacturing a phase-change memory device includes providing a substrate including a plurality of bottom electrodes, patterning the substrate to form a plurality of pores in the substrate extending from a surface of the substrate to the bottom electrodes, depositing a phase-change material over the substrate, implanting one or more of a Ge, Sb and Te in the phase-change material to amorphize at least a portion of the phase-change material inside the pore, planarizing the device to exposed the surface of the substrate, and forming a plurality of top electrodes over the pores, in contact with the phase-change material.

16 Claims, 4 Drawing Sheets

(56) References Cited

U.S. PATENT DOCUMENTS

2013/0078475 A1   3/2013   Zheng
2019/0325954 A1   10/2019  Kim

OTHER PUBLICATIONS

Authorized Officer Wang,Xiaofeng, PRC National IP Administration as ISA, related PCT application PCT/CN2021/126064, ISR and Written Opinion, 9 pages total, dated Jan. 29, 2022.
Raoux et al., "Amorphization of Crystalline Phase Change Material by Ion Implantation" 2010 MRS Spring Meeting, Apr. 2010, pp. 1-7.
Wong et al., "Phase Change Memory" Proceedings of the IEEE, vol. 98, No. 12, Dec. 2010, pp. 1-27.
Ralph Schneider, German Patent and Trademark Office, Office Action and Examination Notice in related German application 11 2021 005 780.4, 7 pages total, mailed Mar. 17, 2024 (English Translation of Original German Document).

* cited by examiner

FILL-IN CONFINED CELL PCM DEVICES

BACKGROUND

The present invention relates to semiconductor devices and more particularly to a method for improved fill-in confined cell Phase-Change Memory (PCM) devices.

Chemical Vapor Deposition (CVD)/Atomic Layer Deposition (ALD) $Ge_2Sb_2Te_5$ alloy (GST) based fill-in confined cell devices are being explored for neuromorphic computing, particularly as synaptic elements, to achieve faster and more energy efficient vector matrix multiplications that are useful in training and inference operations in neural networks.

These devices are attractive compared to other pillar cell designs due to their low resistance-drift coefficient.

In order to fabricate these devices, it is important to deposit the GST inside a pore as either nano-crystalline or crystalline. Deposited amorphous GST shrinkage can cause defects during downstream processing. This shrinkage can be due to due to phase transformation.

Alternatively, deposited crystalline (or nano-crystalline) GST (c-GST) is rough, which can lead to a non-uniform recesses into the pore and grain pull-out during a Chemical Mechanical Polishing (CMP) planarization process. In some cases, delamination of crystalline GST is also observed.

These issues can lead to issues with a top contact interface and can introduce significant device-to-device variability.

BRIEF SUMMARY

According to an embodiment of the present invention, a method for manufacturing a phase-change memory device includes providing a substrate including a plurality of bottom electrodes, patterning the substrate to form a plurality of pores in the substrate extending from a surface of the substrate to the bottom electrodes, depositing a phase-change material over the substrate, implanting one or more of a Ge, Sb and Te in the phase-change material to amorphize at least a portion of the phase-change material inside the pore, planarizing the device to exposed the surface of the substrate, and forming a plurality of top electrodes over the pores, in contact with the phase-change material.

According to some embodiments, a method for manufacturing a phase-change memory device includes providing a substrate including a plurality of bottom electrodes, patterning the substrate to form a plurality of pores in the substrate extending from a surface of the substrate to the bottom electrodes, depositing a phase-change material over the substrate, planarizing the device to exposed the surface of the substrate, implanting one or more of a Ge, Sb and Te in the phase-change material to amorphize at least a portion of the phase-change material inside the pore, planarizing the device to exposed the surface of the substrate, and forming a plurality of top electrodes over the pores, in contact with the phase-change material.

According to one or more embodiments of the present invention, a phase-change memory device includes a bottom electrode, a substrate formed on the bottom electrode, a pore formed in the substrate extending to the bottom electrode, a phase-change material disposed in the pore and electrically connected to the bottom electrode and comprising an amorphous portion disposed in contact with a top electrode and a crystalline portion disposed below the amorphous portion, wherein the amorphous portion comprises implanted ions, and a top electrode disposed over the substrate in contact with the amorphous portion of the phase-change material, wherein the interface between the phase-change material and the top electrode is without voids.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide for:

a method of amorphizatizing a deposited GST film using Ge, Sb or Te implants, without changing a composition of the GST;

a method achieving good contact between a deposited GST and a top electrode metal; and a method of forming a GST film that reduces or eliminates delamination defects during CMP.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

Preferred embodiments of the present invention will be described below in more detail, with reference to the accompanying drawings.

DETAILED DESCRIPTION

Phase-Change Memory (PCM) is based on a chalcogenide glass material, which changes its phase from crystalline to amorphous and back again when suitable electrical currents are applied. GST alloy (germanium-antimony-tellurium or $Ge_2Sb_2Te_5$) is one such chalcogenide glass material. Each phase has a differing resistance level, which is stable until the phase is changed. The maximum and minimum resistance levels in a PCM device are the basis for binary one or zero values.

Embodiments of the present invention include methods for amorphization of a GST film using an implant process prior to CMP planarization. According to some embodiments, Ge, Sb or Te implants are used to amorphizatize the GST film, without substantially changing (e.g., less than 1% material) the composition of the GST. Embodiments of the present invention achieve good contact between the GST and a top electrode metal (not show) and exhibit no delamination defects.

Figure 1:
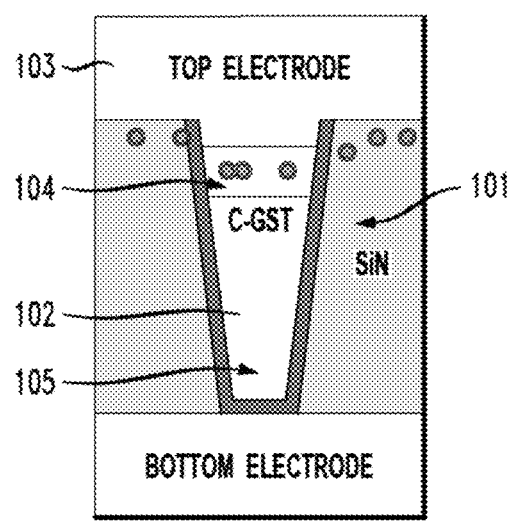
FIGS. 1-6 illustrate a method for manufacturing a PCM device according to one or more embodiments of the present invention.
Figure 2:
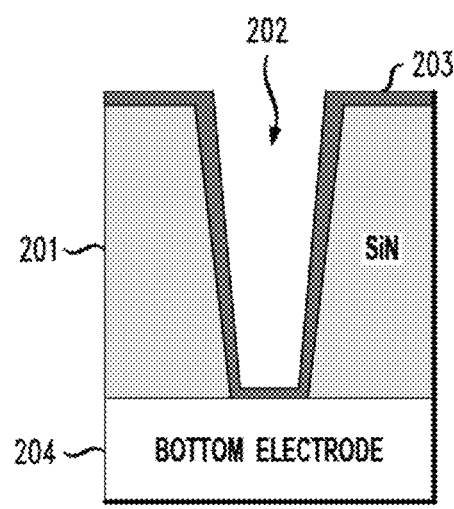

According to some embodiments, a confined cell 101 is formed with a void-free fill of phase-change material 102 (see FIG. 1). Embodiments of the present invention achieve good interfacial contact between the phase-change material 102 and a top electrode 103. According to at least one embodiment, a first portion of the phase-change material 104 (e.g., near the top electrode) is amorphous and a second portion 105 is crystalline (e.g., near a bottom electrode).

It should be understood that confined cell refers to a general category of PCM cell, and can be compared with contact minimized PCM cells. In a confined cell, a current flow is most confined in the phase-change material (e.g., the phase-change material has a smallest cross-sectional area with respect to current flow). In a contact minimized cell, an electrode that connects to the phase-change material has a smallest cross-sectional area through which the current flows (e.g., the current is most confined by the contact to the phase change material).

According to at least one embodiment, a method of manufacturing a PCM device is described with reference to FIGS. 2-7 and comprises providing a substrate 201 (e.g., an interlayer dielectric (ILD)) patterned to include a plurality of pores (e.g., pore 202) formed therein. According to some embodiments a liner 203 is formed on the substrate 201. According to some embodiments, the pores extend through the substrate 201 and to a bottom electrode 204 disposed below the substrate 201.

It should be understood that the substrate is patterned to have pores corresponding to the locations of a plurality of bottom electrodes, and that the bottom electrodes can be formed by depositing a bottom electrode metal on a lower surface of the substrate and patterning the bottom electrode metal.

According to some embodiments, the substrate is formed of silicon nitride (SiN). The bottom electrode 204 can be formed of, for example, a metal or metal nitride. According to some embodiments, the liner 203 is a metallic liner formed by a CVD or ALD process. The liner can be formed of, for example, titanium nitride (TiN), titanium carbide (TiC), tungsten carbide (WC), tungsten nitride (WN), carbon (C), nitridohafnium (HfN), hafnium carbide (HfC), vanadium nitride (VN), vanadium carbides (VC), tantalum nitride (TaN), tantalum carbide (TaC), titanium silicon nitride (TiSiN), titanium aluminum nitride (TiAlN), tantalum silicon nitride (TaSiN), tantalum aluminum nitride (TaAlN), other carbides or nitrides of transition, refractory metals, etc.

Figure 3:
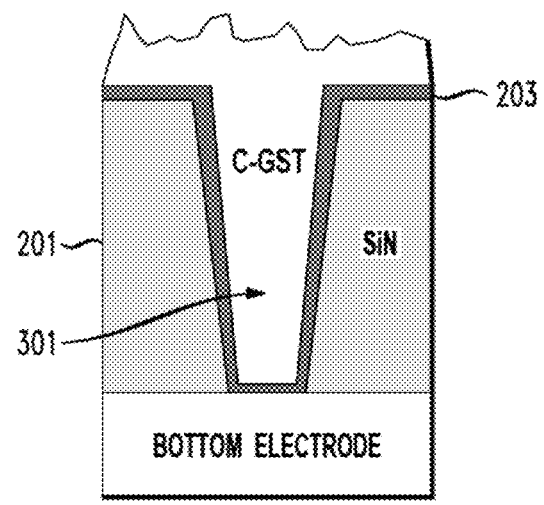

According to some embodiments, a phase-change material 301 such as a crystalline (poly-crystalline) or nanocrystalline GST film is deposited over the substrate 201 and liner 203 using a CVD/ALD process as shown in FIG. 3. According to some embodiments, the phase change material 301 is deposited in a poly-crystalline state, avoiding shrinkage/density change associated with a phase transition associated with depositing the phase change material in an amorphous state and later crystallization, which can result in voids forming within the material. According to some embodiments, the phase-change material 301 is deposited by a Physical Vapor Deposition (PVD) process or a combination of CVD/ALD and PVD processes.

According to some embodiments, the phase-change material 301 can be a single element (such as Sb only) or binary compounds GeTe or SbTe, with various stoichiometries, or a ternary alloy comprising of Ge, Te and Sb. Additionally, the phase change materials can be doped or intermixed with less than about 20% of nitrogen (N), carbon (C), oxygen (O), silicon (Si) or selenium (Se), or alloys containing these elements.

Figure 4:
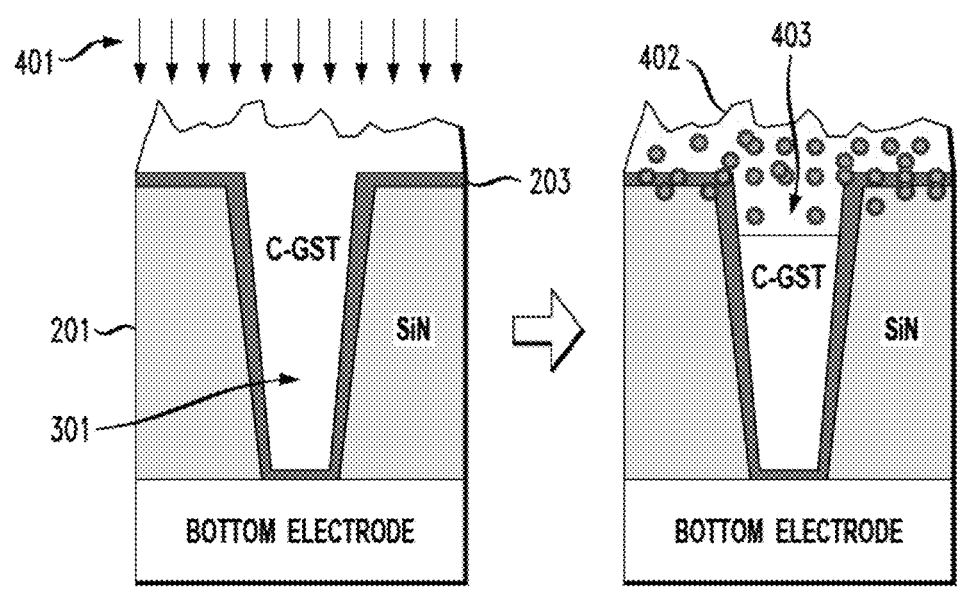

Referring to FIG. 4, according to some embodiments, a Ge, Sb or Te beam line implantation 401 is used to amorphize an overburden film 402 (i.e., a portion above the substrate 201 and liner 203) and at least a portion 403 of the phase-change material 301 inside the pore. According to some embodiments, the whole of the phase-change material 301 inside the pore is amorphized. According to some embodiments, the implants (based on the film/compound) can be used for amorphization of the phase-change material, without changing the composition of the phase-change material.

According to some embodiments, the implantation dose of the Ge, Sb and/or Te is less than about $5 \times 10^{15}$ cm$^{-2}$. According to at least one embodiment, the implantation 401 is performed at low temperatures (e.g., cold chuck, −20 degrees Celsius) to create a sharp amorphous/crystalline boundary. According to some embodiments, an implanter current of ions (ion flux) is controlled such that excessive self-heating does not take place, and re-crystallization is avoided. For example, the increase in temperature due to the ion implantation can be maintained below the crystallization temperature of the phase-change material (e.g., below about 165 degrees Celsius for GST225). Accordingly, one of ordinary skill in the art would understand how to achieve a dose needed to amorphized the GST.

According to one or more embodiments, Ge, Sb, and/or Te is used during the implantation 401 to avoid introducing impurities other than atoms already in the GST alloy. According to some embodiments, other elements can be implanted for the purpose of the amorphization. For example, Xe (54) can be used, which is a noble gas to obtain a substantially similar amorphization effect as Te (52).

It should be understood that the ion implantation 401 can have the effect of changing poly-crystalline material into an amorphous material, without substantially modifying the overall composition of the material.

Figure 5:
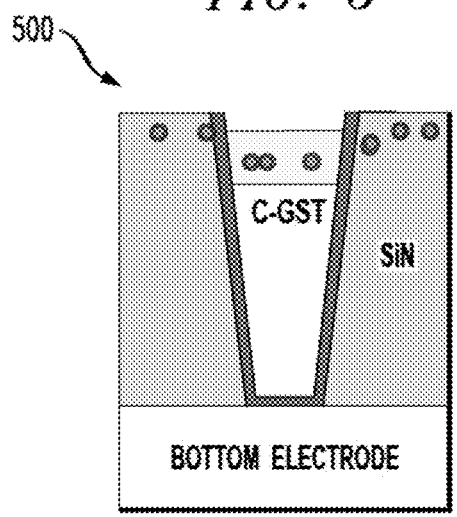

According to one or more embodiments, the device 500 is planarized as shown in FIG. 5, e.g., by a CMP, to remove the overburden film 402 and a top portion of the liner 203.

According to some embodiments, and as shown in FIG. 5, some dopant atoms will be implanted the dielectric layer in the case of the planar implants. The dose within the dielectric layer does not change the stoichiometry of the dielectric material.

According to some embodiments, a first CMP process is performed to partially remove the overburden film 402, followed by the implantation 401, and a second CMP process to fully planarize the structure (e.g., remove an upper portion of the liner 203 on the substrate 201).

According to some embodiments, the CMP process is performed on the phase change material in the amorphous phase, which substantially avoids the CMP pull out or break off crystalline chunks, which can remove phase-change material from the top of the pore. According to one or more embodiments, the phase change material is deposited in a poly-crystalline form and amorphized prior to the CMP process. According to some embodiments, subsequent processes have a high temperature budget, where the phase change material ends up poly-crystalline by the time the wafer processing is complete.

Figure 6:
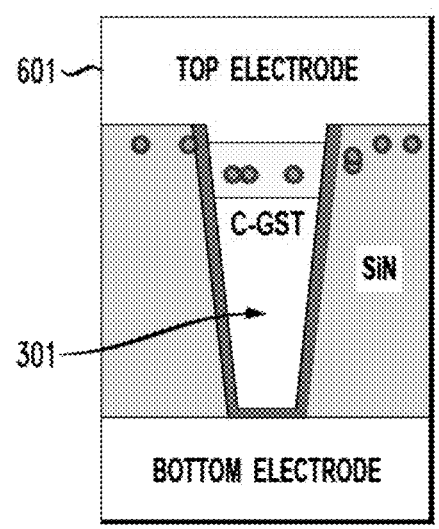

According to some embodiments, a top electrode 601 is deposited over the pore, in contact with the phase-change material 301 (see FIG. 6). According to one or more embodiments, the top electrode 601 is patterned following deposition, and downstream integration of subsequent wiring levels (not shown) is performed.

During electrical programming of the phase-change memory cell, at least some (or in some cases all) of the phase change material undergoes phase transformations, which changes the electrical resistance of the phase change memory cell.

According to some embodiments, a plurality of the PCM devices are arranged as a 3-D crossbar array. According to at least one embodiment, each PCM device in the array is connected to a selector device, such as an ovonic threshold switch or a select transistor.

Figure 7:
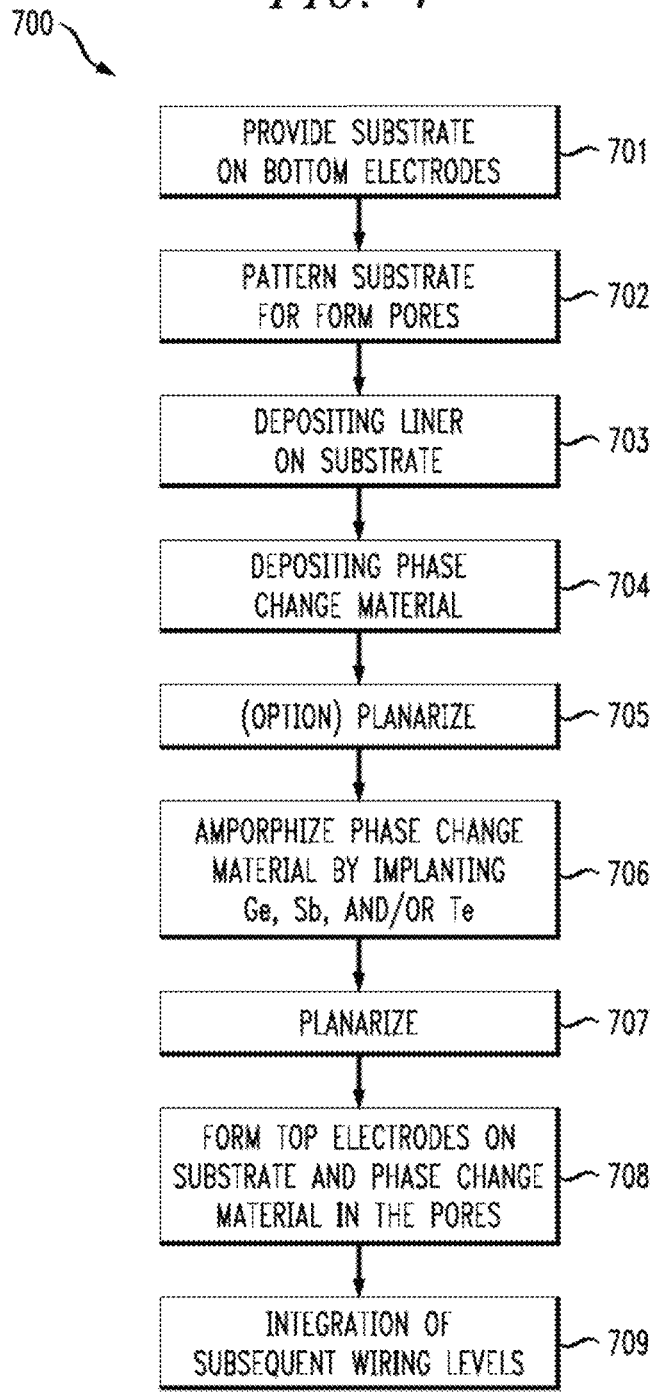
FIG. 7 is a flow diagram of a method for manufacturing a PCM device according to one or more embodiments of the present invention.

Referring to FIG. 7, a method for manufacturing a PCM device 700 comprises providing a substrate, such as an interlayer dielectric (ILD), on a plurality of bottom electrodes 701, and patterning the substrate 702 to form a plurality of pores or vias therein extending from a surface of the substrate to the bottom electrodes. The method further comprises depositing a liner on the surface of the substrate 703. Block 703 can further include etching the liner (such as by a reactive ion etch). The method includes depositing a phase-change material 704, such as a crystalline or nano-crystalline GST film, over the substrate and liner. According to some embodiments, block 704 includes an anneal to densify the deposited phase-change material. The method further comprises implanting one or more of a Ge, Sb or Te in the phase-change material 706 to amorphize at least a portion of the phase-change material inside the pore. According to some embodiments, the method further comprises planarizing the device 707 to expose the surface of the substrate, removing the overburden film and a top portion of the liner.

According to some embodiments, a first CMP process 705 performed to partially remove the overburden film, followed by the implantation 706, and a second CMP process 707 to fully planarize the structure, removing an upper portion of the liner on the substrate.

According to some embodiments, top electrodes are formed 708 by depositing a top electrode metal over the pores, in contact with the phase-change material, and patterning the top electrode metal. According to at least one embodiments, downstream integration of subsequent wiring levels (not shown) is performed 709.

According to at least one embodiment, the method further includes a wet clean between the amorphization 706 and the planarization 707.

Recapitulation:

A method for manufacturing a phase-change memory device 700 includes providing a substrate including a plurality of bottom electrodes 701, patterning the substrate to form a plurality of pores in the substrate extending from a surface of the substrate to the bottom electrodes 702, depositing a phase-change material over the substrate 704, implanting one or more of a Ge, Sb and Te in the phase-change material to amorphize at least a portion of the phase-change material inside the pore 706, planarizing the device to exposed the surface of the substrate 707, and forming a plurality of top electrodes over the pores, in contact with the phase-change material 708.

According to some embodiments, a method for manufacturing a phase-change memory device 700 includes providing a substrate including a plurality of bottom electrodes 701, patterning the substrate to form a plurality of pores in the substrate extending from a surface of the substrate to the bottom electrodes 702, depositing a phase-change material over the substrate 704, planarizing the device to exposed the surface of the substrate 705, implanting one or more of a Ge, Sb and Te in the phase-change material to amorphize at least a portion of the phase-change material inside the pore 706, planarizing the device to exposed the surface of the substrate 707, and forming a plurality of top electrodes over the pores, in contact with the phase-change material 708.

According to one or more embodiments of the present invention, a phase-change memory device includes a bottom electrode 204, a substrate 201 formed on the bottom electrode, a pore 202 formed in the substrate extending to the bottom electrode, a phase-change material 301 disposed in the pore and comprising an amorphous portion 104 disposed in contact with a top electrode and a crystalline portion 105 disposed below the amorphous portion, wherein the amorphous portion comprises implanted ions, and a top electrode 601 disposed over the substrate in contact with the amorphous portion of the phase-change material, wherein the interface between the phase-change material and the top electrode is without voids.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for manufacturing a phase-change memory device comprising:
   providing a substrate including a plurality of bottom electrodes;
   patterning the substrate to form a plurality of pores in the substrate extending from a surface of the substrate to the bottom electrodes;
   depositing a crystalline phase-change material over the substrate, wherein the phase-change material is a GST film, to fill the plurality of pores and create an overburden portion on the surface of the substrate;
   implanting one or more of a Ge, Sb and Te in the phase-change material to amorphize the overburden at least a portion of the phase-change material inside the pores, during the implantation, without changing a composition of the GST, and avoiding introduction of impurities other than atoms already in the GST, while controlling an ion flux applied during the implantation such that a self-annealing caused by the implantation does not reach a crystallization temperature of the phase-change material;
   planarizing the device to expose the surface of the substrate; and
   forming a plurality of top electrodes over the pores, in contact with the phase-change material.

2. The method of claim 1, wherein the substrate is an interlayer dielectric (ILD), the method further comprising depositing a liner on the surface of the substrate before depositing the phase-change material.

3. The method of claim 1, wherein the phase-change material is one of crystalline and nano-crystalline.

4. The method of claim 1, wherein an implantation dose of the at least one of Ge, Sb and Te is less than about $5\times10^{15}$ cm$^{-2}$.

5. The method of claim 1, further comprising annealing the phase-change material prior to the implantation.

6. The method of claim 1, wherein forming the top electrodes further comprises:
   depositing a top electrode metal over the pores, in contact with the phase-change material; and
   patterning the top electrode metal to form the plurality of top electrodes.

7. The method of claim 1, further comprising manufacturing at least one wire level on the substrate.

8. A method for manufacturing a phase-change memory device comprising:
   providing a substrate including a plurality of bottom electrodes;
   patterning the substrate to form a plurality of pores in the substrate extending from a surface of the substrate to the bottom electrodes;
   depositing over the substrate a GST film, to fill the plurality of pores and create an overburden portion on the surface of the substrate;
   carrying out a planarization process to partially remove the overburden portion;
   amorphizing a remaining portion of the overburden and forming an amorphous plug of phase-change material in at least an upper portion of the pore by implanting one or more of Ge Sb and Te in the GST film, the amorphizing of the remaining portion of the overburden and the forming of the amorphous plug occurring during the implantation without changing a composition of the GST, and avoiding introduction of impurities other than atoms already in the GST;
   planarizing the device to expose the surface of the substrate; and
   forming a plurality of top electrodes over the pores, in contact with the phase-change material.

9. The method of claim 8, wherein the substrate is an interlayer dielectric (ILD), the method further comprising depositing a liner on the surface of the substrate before depositing the phase-change material.

10. The method of claim 8, wherein the phase-change material is one of crystalline and nano-crystalline.

11. The method of claim 8, wherein an implantation dose of the at least one of Ge Sb and Te is less than about $5\times10^{15}$ cm$^{-2}$.

12. The method of claim 8, further comprising controlling an ion flux applied during the implantation such that a self-annealing caused by the implantation does not reach a crystallization temperature of the phase change material.

13. The method of claim 8, further comprising annealing the phase-change material prior to the implantation.

14. The method of claim 8, further comprising one of doping and intermixing the phase-change material with less than about 20% of N, C, O, Si or Se, or alloys thereof.

15. The method of claim 8, wherein forming the top electrodes further comprises:
   depositing a top electrode metal over the pores, in contact with the phase-change material; and
   patterning the top electrode metal to form the plurality of top electrodes.

16. The method of claim 8, further comprising manufacturing at least one wire level on the substrate.

* * * * *